(12) United States Patent
Zheng et al.

(10) Patent No.: US 9,660,301 B2
(45) Date of Patent: May 23, 2017

(54) METHODS AND DEVICES FOR BATTERY PROTECTION

(71) Applicant: Xiaomi Inc., Beijing (CN)

(72) Inventors: Zhongxiang Zheng, Beijing (CN); Jianjun Zhang, Beijing (CN); Jinchao Li, Beijing (CN)

(73) Assignee: Xiaomi Inc., Beijing (CN)

( * ) Notice: Subject to any disclaimer, the term of this patent is extended or adjusted under 35 U.S.C. 154(b) by 207 days.

(21) Appl. No.: 14/327,632

(22) Filed: Jul. 10, 2014

(65) Prior Publication Data

US 2015/0118525 A1    Apr. 30, 2015

Related U.S. Application Data

(63) Continuation of application No. PCT/CN2014/077103, filed on May 9, 2014.

(30) Foreign Application Priority Data

Oct. 29, 2013   (CN) .......................... 2013 1 0520503

(51) Int. Cl.
*H01M 10/02*   (2006.01)
*H01M 10/48*   (2006.01)
(Continued)

(52) U.S. Cl.
CPC .......... *H01M 10/425* (2013.01); *G01R 31/18* (2013.01); *H01M 10/48* (2013.01); *G05B 9/02* (2013.01); *H01M 2010/4271* (2013.01)

(58) Field of Classification Search
CPC .... H01M 10/42; H01M 10/425; H01M 10/48; H01M 2/1066; H01M 2/22; H01M 2/20; H01M 2/04; H01M 2/02
See application file for complete search history.

(56) References Cited

U.S. PATENT DOCUMENTS 4,025,696 A    5/1977   Tucholski et al.
6,163,134 A    12/2000  Powers et al.
(Continued)

FOREIGN PATENT DOCUMENTS

CN    101164213    4/2008
CN    201898180    7/2011
(Continued)

OTHER PUBLICATIONS

Search Report for European Application No. 14190352.6, from the European Patent Office, dated Mar. 16. 2015 (6 pages).
(Continued)

*Primary Examiner* — Kenneth Douyette
(74) *Attorney, Agent, or Firm* — Finnegan, Henderson, Farabow, Garrett & Dunner LLP

(57) ABSTRACT

An electronic apparatus is provided. The electronic apparatus includes: a battery; at least one pressure sensor provided on a surface of the battery; and a controller electrically connected with the at least one pressure sensor. The at least one pressure sensor samples a pressure parameter on the surface of the battery. The controller acquires the pressure parameter, detects a magnitude relation between the pressure parameter and a predefined threshold value, and generates a control instruction for protecting the battery based on the detected magnitude relation.

5 Claims, 8 Drawing Sheets

(51) Int. Cl.
*H01M 10/42* (2006.01)
*G05B 9/02* (2006.01)
*G01R 31/18* (2006.01)

(56) References Cited

U.S. PATENT DOCUMENTS

| | | |
|---|---|---|
| 7,479,894 B2 | 1/2009 | Song |
| 2006/0250262 A1 | 11/2006 | Song |
| 2007/0054157 A1 | 3/2007 | Ryu et al. |
| 2007/0078366 A1* | 4/2007 | Haggstrom ......... A61F 13/0203 602/53 |
| 2010/0026509 A1 | 2/2010 | Boehm et al. |
| 2010/0026609 A1 | 2/2010 | Otsuki et al. |
| 2010/1026609 | 2/2010 | Otsuki et al. |
| 2011/0202914 A1 | 8/2011 | Kim et al. |
| 2012/0043941 A1 | 2/2012 | Lee |
| 2012/0270077 A1* | 10/2012 | Koetting ............... H01M 10/48 429/50 |
| 2013/0022848 A1 | 1/2013 | Schroeter et al. |
| 2013/0093383 A1 | 4/2013 | Kim et al. |

FOREIGN PATENT DOCUMENTS

| | | |
|---|---|---|
| CN | 202585672 | 12/2012 |
| CN | 202872350 | 4/2013 |
| CN | 103117418 | 5/2013 |
| CN | 103299476 | 9/2013 |
| DE | 102010012936 A1 | 9/2011 |
| JP | 11-162527 | 6/1999 |
| JP | 2000322359 | 11/2000 |
| JP | 2003-234055 | 8/2003 |
| JP | 2008-535457 | 8/2008 |
| JP | 2008-234840 | 10/2008 |
| JP | 2010541043 | 12/2010 |
| JP | 2011-009042 | 1/2011 |
| JP | 2011-009042 A | 1/2011 |
| JP | 2011-142003 | 7/2011 |
| JP | 2012064014 | 3/2012 |
| JP | 2013-175149 | 9/2013 |
| KR | 10-2006-0110771 | 10/2006 |
| KR | 1020070075927 | 7/2007 |
| KR | 10-2009-0120268 | 11/2009 |
| KR | 100964175 | 6/2010 |
| KR | 1020120023896 | 3/2012 |
| RU | 93012714 | 5/1995 |
| RU | 2332755 | 8/2008 |
| WO | WO 2012/066516 | 5/2012 |

OTHER PUBLICATIONS

International Search Report of PCT/CN2014/077103, mailed from the State Intellectual Property Office of China on Aug. 20, 2014.
English translation of International Search Report of PCT/CN2014/077103, mailed from the State Intellectual Property Office of China on Aug. 20, 2014.
European Examination Report for Application No. 14190352.6, from the European Patent Office, dated Feb. 3, 2016 (6 pages).
Notice of Allowance from Korean Intellectual Property Office for Application No. 10-2014-7021453, dated Sep. 1, 2016, 4 pages.
Russian Federation Official Action for Application No. 2015125315, dated Jul. 27, 2016, 14 pages.

* cited by examiner

METHODS AND DEVICES FOR BATTERY PROTECTION

CROSS REFERENCE TO RELATED APPLICATIONS

This application is a continuation of International Application No. PCT/CN2014/077103, filed May 9, 2014, which is based upon and claims priority to Chinese Patent Application No. 201310520503.7, filed Oct. 29, 2013, the entire contents of all of which are incorporated herein by reference.

TECHNICAL FIELD

The present disclosure relates to the field of electronic apparatus and, more particularly, to methods and devices for battery protection in an electronic apparatus.

BACKGROUND

With rapid development of mobile terminals, such as mobile phones and tablet computers, the safety issues of these electronic apparatuses have gradually been put on the agenda. For example, the battery protection issues have become more and more important.

Conventionally, the battery protection is mainly performed by: detecting whether the input or output current of the battery exceeds a certain limit via a detection circuit provided inside the battery, and triggering a protection circuit inside the battery if the input or output current of the battery exceeds the certain limit. The protection circuit is used for cutting off the charging circuit or electricity supplying circuit inside the battery, so as to realize the protection of the battery. In addition, the battery protection can also be achieved by detecting the input or output voltage of the battery.

However, even if there is no current input or output, or no voltage input or output in the battery, the battery may still need to be protected. For example, in the case that an external force is applied to the battery, or the interior of the battery expands due to a lot of heat produced by the chemical reaction inside the battery, the battery may easily be damaged, resulting in harms such as explosion of the battery.

SUMMARY

According to a first aspect of the present disclosure, there is provided an electronic apparatus, comprising: a battery; at least one pressure sensor provided on a surface of the battery; and a controller electrically connected with the at least one pressure sensor. The at least one pressure sensor samples a pressure parameter on the surface of the battery. The controller acquires the pressure parameter, detects a magnitude relation between the pressure parameter and a predefined threshold value, and generates a control instruction for protecting the battery based on the detected magnitude relation.

According to a second aspect of the present disclosure, there is provided a battery protection method, comprising: acquiring a pressure parameter on a surface of a battery; detecting a magnitude relation between the pressure parameter and a predefined threshold value; and generating a control instruction for protecting the battery based on the detected magnitude relation.

According to a third aspect of the present disclosure, there is provided an electronic device, comprising: a processor; and a memory for storing instructions executable by the processor. The processor is configured to: acquire a pressure parameter on a surface of a battery; detect a magnitude relation between the pressure parameter and a predefined threshold value; and generate a control instruction for protecting the battery based on the detected result.

According to a fourth aspect of the present disclosure, there is provided a non-transitory computer-readable storage medium having stored therein instructions that, when executed by one or more processors of an electronic device, cause the electronic device to perform operations including: acquiring a pressure parameter on a surface of a battery; detecting a magnitude relation between the pressure parameter and a predefined threshold value; and generating a control instruction for protecting the battery based on the detected magnitude relation.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments consistent with the invention and, together with the description, serve to explain the principles of the invention.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. It is apparent that the described embodiments are only a part of embodiments of the present disclosure, but not all the embodiments.

Figure 1:
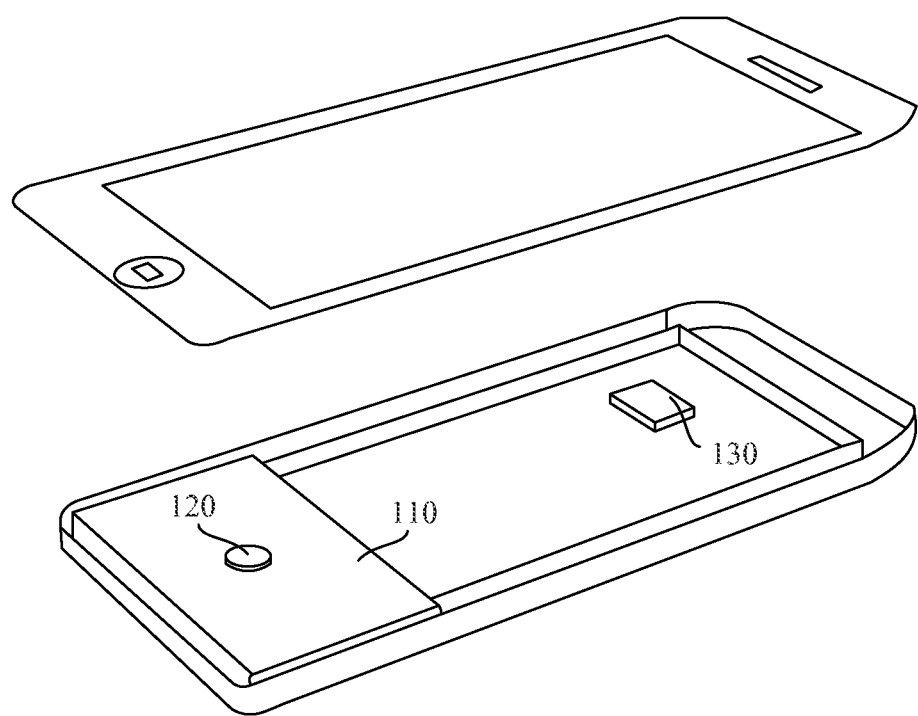
FIG. 1 is an exemplary diagram of an electronic apparatus, according to an exemplary embodiment.

FIG. 1 illustrates an exemplary diagram of an electronic apparatus 100 provided by one embodiment of the present disclosure. The electronic apparatus 100 may include: a battery 110, at least one pressure sensor 120 provided on a surface of the battery 110, and a controller 130 electrically connected with the pressure sensor 120.

The pressure sensor 120 samples a pressure parameter on the surface of the battery 110.

The controller 130 acquires the pressure parameter on the surface of the battery 110, detects a magnitude relation between the pressure parameter and a predefined threshold value, and generates a control instruction for protecting the battery 110 based on the detected result. In doing so, the safety hazard existing when the battery is impacted or is extruded may be eliminated, and the battery and/or the electronic apparatus may be protected.

Figure 2A:
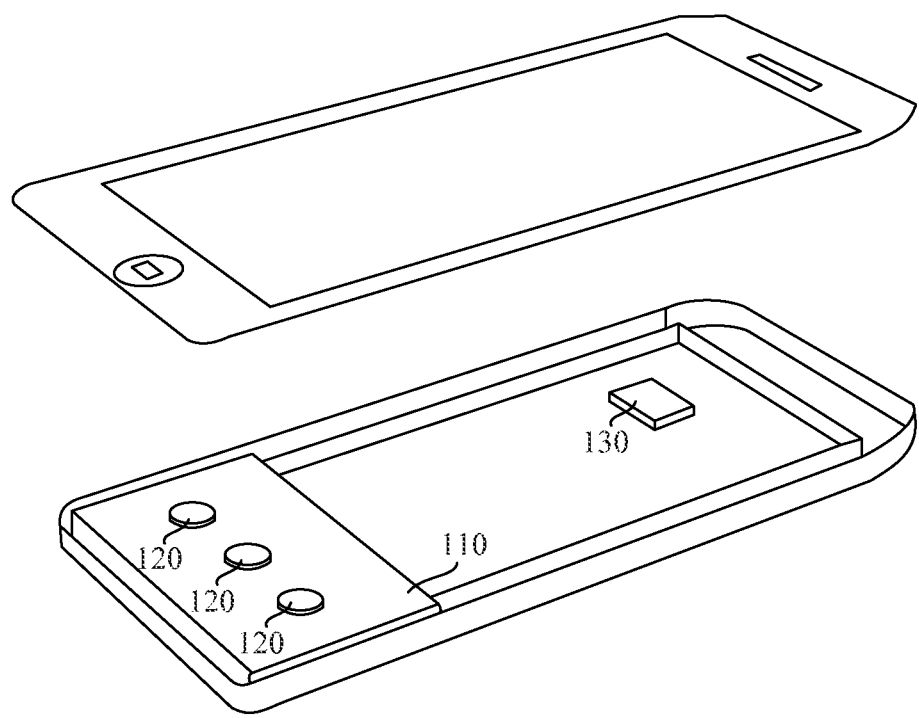
FIG. 2A is another exemplary diagram of an electronic apparatus, according to an exemplary embodiment.

FIG. 2A illustrates an exemplary diagram of an electronic apparatus 200a provided by another embodiment of the present disclosure. The electronic apparatus 200a may include: a battery 110, a plurality of pressure sensors 120 provided on a surface of the battery 110, and a controller 130 electrically connected with the pressure sensor 120. In the present embodiment, the electronic apparatus 200a includes three pressure sensors 120 as an example. It should be understood that the electronic apparatus 220a may include any number of pressure sensors without departing from the scope of the present disclosure.

The three pressure sensors 120 may be provided uniformly at different positions on the surface of the battery 110, and the predefined threshold values to which the pressure sensors 120 at different positions respectively correspond may be the same or different.

Each of the pressure sensors 120 may be provided at an outer surface of the battery 110 adjacent to a side of a housing of the electronic apparatus 220a, or may be provided at an inner surface of the battery 110 adjacent to a side of a battery cell inside the battery 110. As shown in FIG. 2A, in the present embodiment, three pressure sensors 120 provided uniformly at the outer surface of the battery 110 adjacent to the side of the housing of the electronic apparatus 220a are described as an example. In actual applications, the number and positions of the pressure sensors 120 may be determined according to actual requirements, and there is no specific limitation thereto.

In addition, the predefined threshold values to which the pressure sensors 120 at different positions respectively correspond may be the same or different. The predefined threshold value, to which a first one of the pressure sensors 120 corresponds, indicates a pressure value to be compared with the pressure parameter on the surface of the battery 110 sampled by the first one of the pressure sensors 120. In the present embodiment, the three pressure sensors 120 at different positions respectively corresponding to different predefined threshold values are described as an example, i.e., the three pressure sensors 120 respectively correspond to a first threshold value, a second threshold value, and a third threshold value which increase progressively.

Each of the pressure sensors 120 samples a pressure parameter on the surface of the battery 110.

The pressure sensors 120 record the pressure parameters on the surface of the battery 110 in real time. The pressure sensors 120 may record an external pressure force exerted on the battery 110 and a pressure action produced by an expansion of the battery due to an interior chemical reaction inside the battery 110.

The controller 130 acquires the pressure parameters on the surface of the battery 110.

The controller 130 may be electrically connected with each pressure sensor 120 to acquire the pressure parameters on the surface of the battery sampled by the pressure sensors 120.

The controller 130 may further detect magnitude relations between the pressure parameters and the predefined threshold values.

In the present embodiment, three predefined threshold values are preset, which are respectively the first threshold value, the second threshold value, and the third threshold value which increase progressively. The controller 130 may detect, at a predetermined time interval, magnitude relations between the pressure parameters and the first threshold value, the second threshold value, and the third threshold value which increase progressively.

For example, in the present embodiment, the predefined threshold values to which the three pressure sensors 120 located at different positions respectively correspond are different, and are respectively the first threshold value, the second threshold value, and the third threshold value which increase progressively. Thus, the controller 130 detects the magnitude relation between the pressure parameter sampled by the first pressure sensor 120 and the first threshold value at the predetermined time interval, detects the magnitude relation between the pressure parameter sampled by the second pressure sensor 120 and the second threshold value at the predetermined time interval, and detects the magnitude relation between the pressure parameter sampled by the third pressure sensor 120 and the third threshold value at the predetermined time interval. In this example, the first threshold value is set as 20 Newton (N), the second threshold value is set as 50 N, and the third threshold value is set as 100 N.

The controller 130 further generates a control instruction for protecting the battery 110 based on the detected result.

According to some embodiments of the present disclosure, if the detected result is that the pressure parameter is above the first threshold value and below the second threshold value, the controller 130 generates a reminder information displaying instruction.

The reminder information displaying instruction is used to trigger the electronic apparatus 220a to issue a reminder alert via a display screen, a speaker and/or a signal lamp. For example, when the battery 110 is being charged by the user, if the pressure parameter sampled by the first pressure sensor 120, which is detected by the controller 130, is above the first threshold value 20 N and below the second threshold value 50 N due to the expansion inside the battery, the reminder information displaying instruction is generated. For instance, the reminder alert may be directly issued by the speaker, or may be issued by displaying information on the display screen, or the like.

Figure 2B:
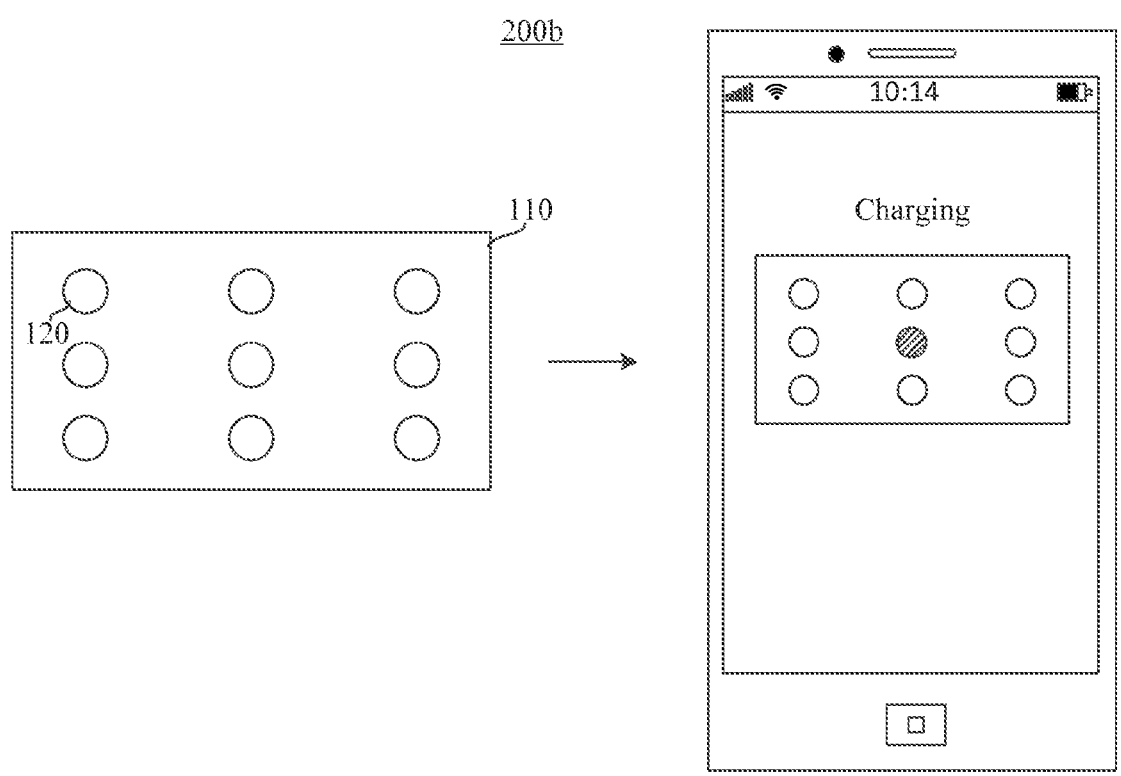
FIG. 2B is an exemplary diagram of a reminder alert, according to an exemplary embodiment.

FIG. 2B illustrates an exemplary diagram of a reminder alert 200b, according to an exemplary embodiment. As shown in FIG. 2B, in the illustrated embodiment, nine pressure sensors 120 are uniformly provided on the surface of the battery 110. When the battery 110 is being charged, nine blocks on the display screen of the electronic apparatus respectively indicate the pressure parameters sampled by respective pressure sensors 120. In a normal state, for example, when the pressure parameter sampled by a first one of the pressure sensors 120 at a middle position is below 20 N, the corresponding block is displayed in green (not shown in the drawing). If the pressure parameter sampled by the first one of the pressure sensors 120 in the middle position at a certain time point exceeds the first threshold value 20 N and is below the second threshold value 50 N, the corresponding block in the middle position of the display screen changes from green to red (which is indicated by the oblique lines in FIG. 2B). Thereby, the reminder alert is issued to the user.

According to some embodiments of the present disclosure, if the detected result is that the pressure parameter is above the second threshold value and below the third threshold value, a sleep instruction may be generated.

The sleep instruction is used to trigger the battery 110 to enter into a sleep state. The battery 110 entering into the sleep state may be controlled by controlling a battery chip inside the battery to stop working. When the pressure parameter on the surface of the battery increases continually, for example, if the pressure parameter sampled by a second one of the pressure sensors 120, which is detected by the controller 130, is above the second threshold value 50 N and below the third threshold value 100 N, the sleep instruction is generated to trigger the battery 110 to enter into the sleep state.

According to some embodiments of the present disclosure, if the detected result is that the pressure parameter is above the third threshold value, a permanent failure instruction may be generated.

The permanent failure instruction is used to trigger the battery 110 to enter into a permanent failure state. When the pressure parameter on the surface of the battery increases continually, for example, if the pressure parameter sampled by a third one of the pressure sensors 120, which is detected by the controller 130, is above the third threshold value 100 N, the permanent failure instruction may be generated to trigger the battery 110 to enter into the permanent failure state.

In addition, after the battery 110 enters into the sleep state, the controller 130 further detects whether the pressure parameter recovers to be below the second threshold value; and if the detected result is that the pressure parameter is below the second threshold value, a sleep recover instruction, which is used to trigger the battery 110 to recover from the sleep state to the normal operating state, may be generated. For example, if the pressure parameter on the surface of the battery does not increase continually, but reduces to be below the second threshold value 50 N after the battery 110 enters into the sleep state, the sleep recover instruction may be generated. For instance, an excitation voltage or an excitation current may be applied to the battery 110, so as to trigger the battery 110 to recover from the sleep state to the normal operating state.

In the above discussed implementation manners, the safety levels for protecting the battery 110 increase progressively. For the battery 110, one of the first threshold value, the second threshold value and the third threshold value may be set, or two or all three of the first threshold value, the second threshold value and the third threshold value may be set. The present disclosure is not limited thereto. By detecting the magnitude relations between the pressure parameters and different predefined threshold values to generate different control instructions by the controller, the battery and/or the electronic apparatus are provided with a protection having different safety levels.

Figure 3:
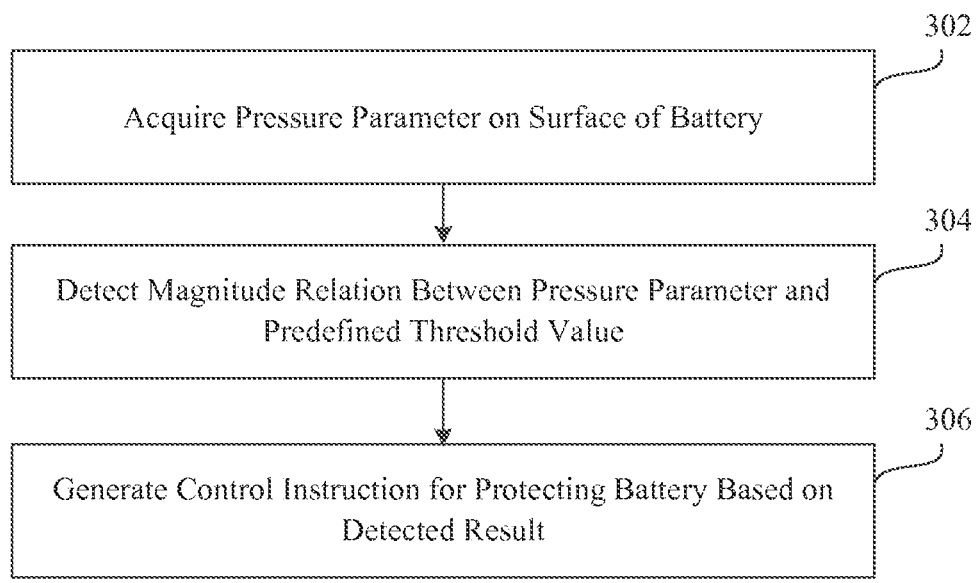
FIG. 3 is a flowchart of a battery protection method, according to an exemplary embodiment.

FIG. 3 illustrates a flowchart of an exemplary battery protection method 300 provided by one embodiment of the present disclosure. The battery protection method 300 may be implemented by the controller 130 shown in FIG. 1 or FIG. 2A. The battery protection method 300 may include the following steps.

In step 302, a pressure parameter on a surface of a battery is acquired.

In step 304, a magnitude relation between the pressure parameter and a predefined threshold value is detected.

In step 306, a control instruction for protecting the battery is generated based on the detected result.

Figure 4:
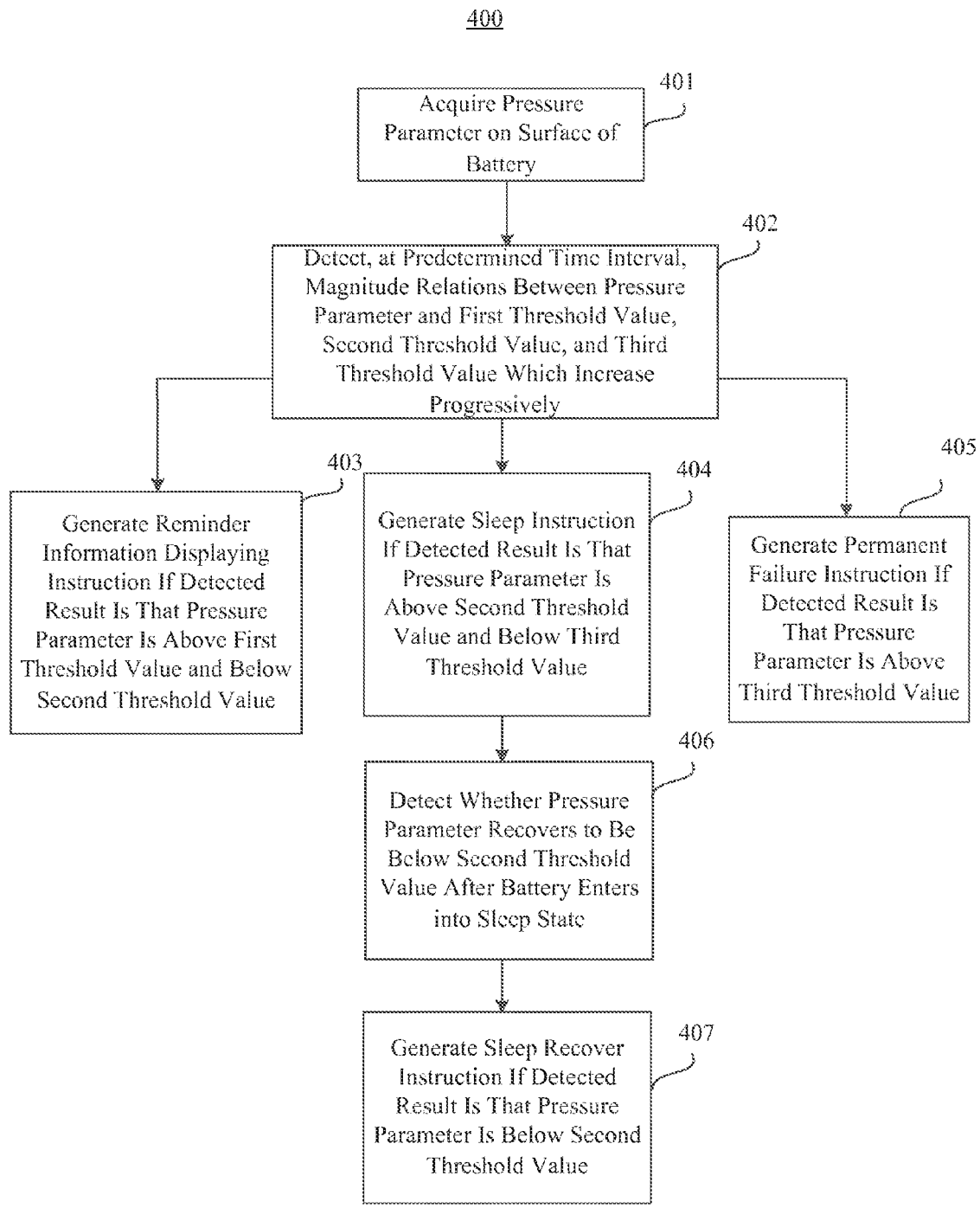
FIG. 4 is a flowchart of another battery protection method, according to an exemplary embodiment.

FIG. 4 illustrates a flowchart of a battery protection method 400 provided by another embodiment of the present disclosure. The battery protection method 400 may be implemented by the controller 130 shown in FIG. 1 or FIG. 2A. The battery protection method 400 may include the following steps.

In step 401, a pressure parameter on a surface of a battery is acquired.

The pressure parameter on the surface of the battery is sampled by installing at least one pressure sensor on the surface of the battery, and the controller is electrically connected with the at least one pressure sensor so as to acquire the pressure parameter on the surface of the battery sampled by the pressure sensor.

In step 402, magnitude relations between the pressure parameter and a first threshold value, a second threshold value, and a third threshold value respectively may be detected at a predetermined time interval. The first, second, and third threshold value may be set to increase progressively.

The three predefined threshold values may be set in advance, and are respectively the first threshold value, the second threshold value, and the third threshold value which increase progressively. The controller may detect, at the predetermined time interval, the magnitude relations between the pressure parameter and the first threshold value, the second threshold value, and the third threshold value which increase progressively. In the present exemplary embodiment, the first threshold value is set to be 20 N, the second threshold value is set to be 50 N, and the third threshold value is set to be 100 N. It should be understood that the first, second, and third threshold values may be set to be different values without departing from the scope of the present disclosure.

In step 403, if the detected result is that the pressure parameter is above the first threshold value and below the second threshold value, a reminder information displaying instruction is generated.

The reminder information displaying instruction is used to trigger the electronic apparatus to issue a reminder alert via a display screen, a speaker and/or a signal lamp. For example, when the battery is being charged by the user, if the pressure parameter detected by the controller is above the first threshold value 20 N and below the second threshold value 50 N due to an expansion inside the battery, the reminder information displaying instruction may be generated. For instance, the reminder alert may be directly issued by the speaker, or may be issued by displaying information on the display screen, or the like.

In step 404, if the detected result is that the pressure parameter is above the second threshold value and below the third threshold value, a sleep instruction is generated.

The sleep instruction is used to trigger the battery to enter into a sleep state. The battery entering into the sleep state may be controlled by controlling a battery chip inside the battery to stop working. When the pressure parameter on the surface of the battery increases continually, if the pressure parameter detected by the controller is above the second threshold value 50 N and below the third threshold value 100 N, the sleep instruction may be generated to trigger the battery to enter into the sleep state.

In step 405, if the detected result is that the pressure parameter is above the third threshold value, a permanent failure instruction is generated.

The permanent failure instruction is used to trigger the battery to enter into a permanent failure state. When the pressure parameter on the surface of the battery increases continually, if the pressure parameter detected by the controller is above the third threshold value 100 N, the permanent failure instruction may be generated to trigger the battery to enter into the permanent failure state.

In addition, after the above step 404, the method 400 may further include the following steps.

In step 406, after the battery enters into the sleep state, whether the pressure parameter recovers to be below the second threshold value is detected.

After the battery enters into the sleep state, the controller detects whether the pressure parameter recovers to be below the second threshold value.

In step 407, if the detected result is that the pressure parameter is below the second threshold value, a sleep recover instruction is generated.

The sleep recover instruction is used to trigger the battery to recover from the sleep state to the normal operating state. If the pressure parameter on the surface of the battery does not increase continually, but reduces to be below 50 N after the battery enters into the sleep state, the sleep recover instruction is generated. For instance, an excitation voltage or an excitation current may be applied to the battery, so as to trigger the battery to recover from the sleep state to the normal operating state.

It should be explained that in some applications, one of the first threshold value, the second threshold value and the third threshold value may be set, or two or all three of the first threshold value, the second threshold value and the third threshold value may be set. The present disclosure is not limited thereto.

The battery protection method provided by the present embodiment acquires the pressure parameter on the surface of the battery, detects the magnitude relation between the pressure parameter and the predefined threshold value, and generates the control instruction for protecting the battery based on the detected result, thereby solving the safety hazard existing when the battery is impacted or is extruded achieving the effect of eliminating the safety hazard existing when the battery is impacted or is extruded, and protecting the battery and/or the electronic apparatus.

The battery protection method provided by the present embodiment further generates different control instructions by detecting the magnitude relations between the pressure parameter and different predefined threshold values, thereby providing the battery and/or the electronic apparatus with a protection having different safety levels.

Figure 5:
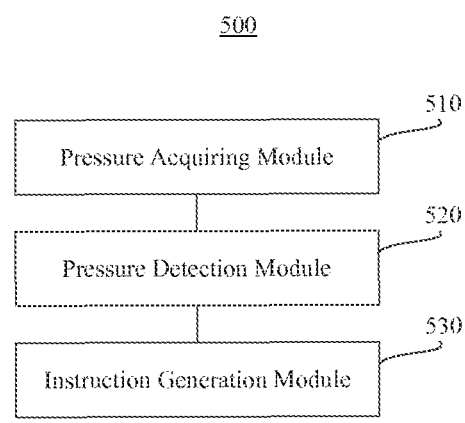
FIG. 5 is an exemplary block diagram of a battery protection device, according to an exemplary embodiment.

FIG. 5 illustrates an exemplary block diagram of a battery protection device 500 provided by one embodiment of the disclosure. The battery protection device 500 may constitute all or a part of the controller 130 of the battery (FIGS. 1 and 2A), and may be implemented by software, hardware or a combination thereof. The battery protection device 500 may include a pressure acquiring module 510, a pressure detection module 520, and an instruction generation module 530.

The pressure acquiring module 510 is configured to acquire a pressure parameter on a surface of the battery.

The pressure detection module 520 is configured to detect a magnitude relation between the pressure parameter and a predefined threshold value.

The instruction generation module 530 is configured to generate a control instruction for protecting the battery based on the detected result.

The battery protection device 500 may reduce the safety hazard existing when the battery is impacted or is extruded and, thus, protect the battery and/or the electronic apparatus.

Figure 6:
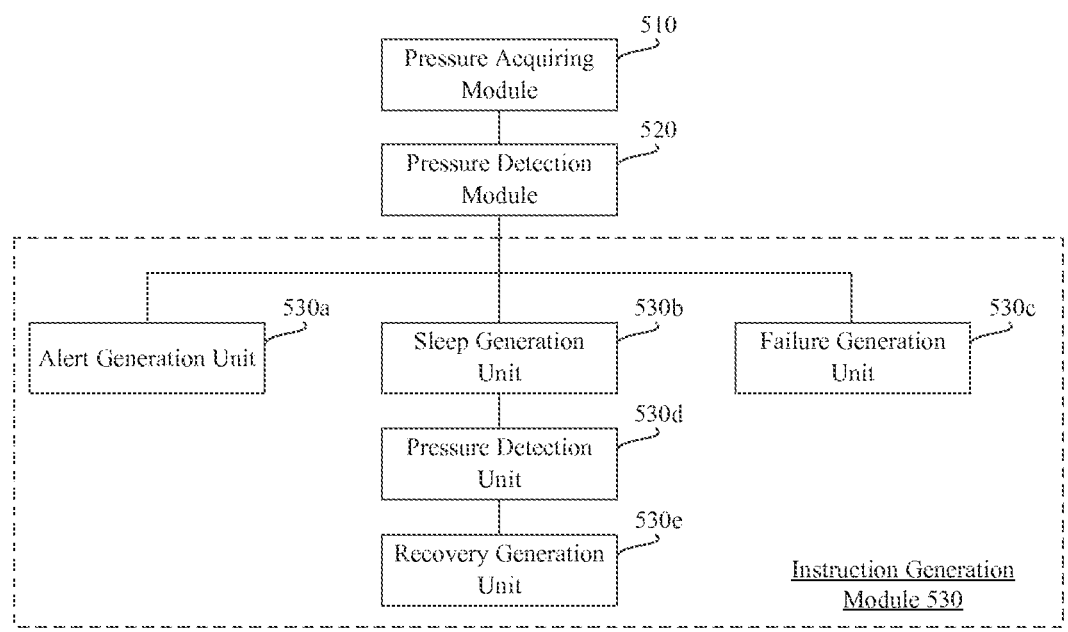
FIG. 6 is another exemplary block diagram of a battery protection device, according to an exemplary embodiment.

FIG. 6 illustrates an exemplary block diagram of a battery protection device 501 provided by another embodiment of the disclosure. Referring to FIG. 6, the battery protection device 501 may constitute all or a part of the controller 130 of the battery (FIGS. 1 and 2A) by software, hardware or a combination thereof. The battery protection device 501 may include the pressure acquiring module 510, the pressure detection module 520, and the instruction generation module 530.

The pressure acquiring module 510 is configured to acquire a pressure parameter on a surface of the battery.

The pressure detection module 520 is configured to detect a magnitude relation between the pressure parameter and a predefined threshold value.

The pressure detection module 520 is further configured to detect, at a predetermined time interval, magnitude relations between the pressure parameter and a first threshold value, a second threshold value, and a third threshold value, which increase progressively in the illustrated embodiment.

The instruction generation module 530 is configured to generate a control instruction for protecting the battery based on the detected result.

For example, the instruction generation module 530 includes an alert generation unit 530a, a sleep generation unit 530b, and a failure generation unit 530c.

The alert generation unit 530a is configured to generate a reminder information displaying instruction if the detected result is that the pressure parameter is above the first threshold value and below the second threshold value. The reminder information displaying instruction is used to trigger the electronic apparatus to issue a reminder alert via a display screen, a speaker and/or a signal lamp.

The sleep generation unit 530b is configured to generate a sleep instruction if the detected result is that the pressure parameter is above the second threshold value and below the third threshold value. The sleep instruction is used to trigger the battery to enter into a sleep state.

The failure generation unit 530c is configured to generate a permanent failure instruction if the detected result is that the pressure parameter is above the third threshold value. The permanent failure instruction is used to trigger the battery to enter into a permanent failure state.

The instruction generation module 530 further includes a pressure detection unit 530d and a recovery generation unit 530e.

The pressure detection unit 530d is configured to detect whether the pressure parameter recovers to be below the second threshold value after the battery enters into the sleep state.

The recovery generation unit 530e is configured to generate a sleep recover instruction if the detected result is that the pressure parameter is below the second threshold value. The sleep recover instruction is used to trigger the battery to recover from the sleep state to the normal operating state.

The battery protection device 501 may reduce the safety hazard existing when the battery is impacted or is extruded and, thus, protect the battery and/or the electronic apparatus.

The battery protection device provided by the present embodiment further generates three different control instructions by detecting the magnitude relations between the pressure parameter and different predefined threshold values, thereby providing the battery and/or the electronic apparatus with a protection having different safety levels.

It should be explained that the battery protection devices provided by the above embodiments are exemplified as the above respective functional modules when protecting the battery. In some applications, the above functions may be distributed to be achieved by different functional modules according to requirements. For example, the interior structure of the devices may be divided into different functional modules for achieving all or a part of the above described functions. In addition, the battery protection devices provided by the above embodiments may be implemented to perform the method embodiments provided in the present disclosure.

Another embodiment of the present disclosure provides an electronic device which may include: one or more processors; a memory; and one or more modules stored in the memory and being configured to be executed by the one or more processors, the one or more modules having the following functions: acquiring a pressure parameter on a surface of a battery; detecting a magnitude relation between the pressure parameter and a predefined threshold value; and generating a control instruction for protecting the battery based on the detected result.

Figure 7:
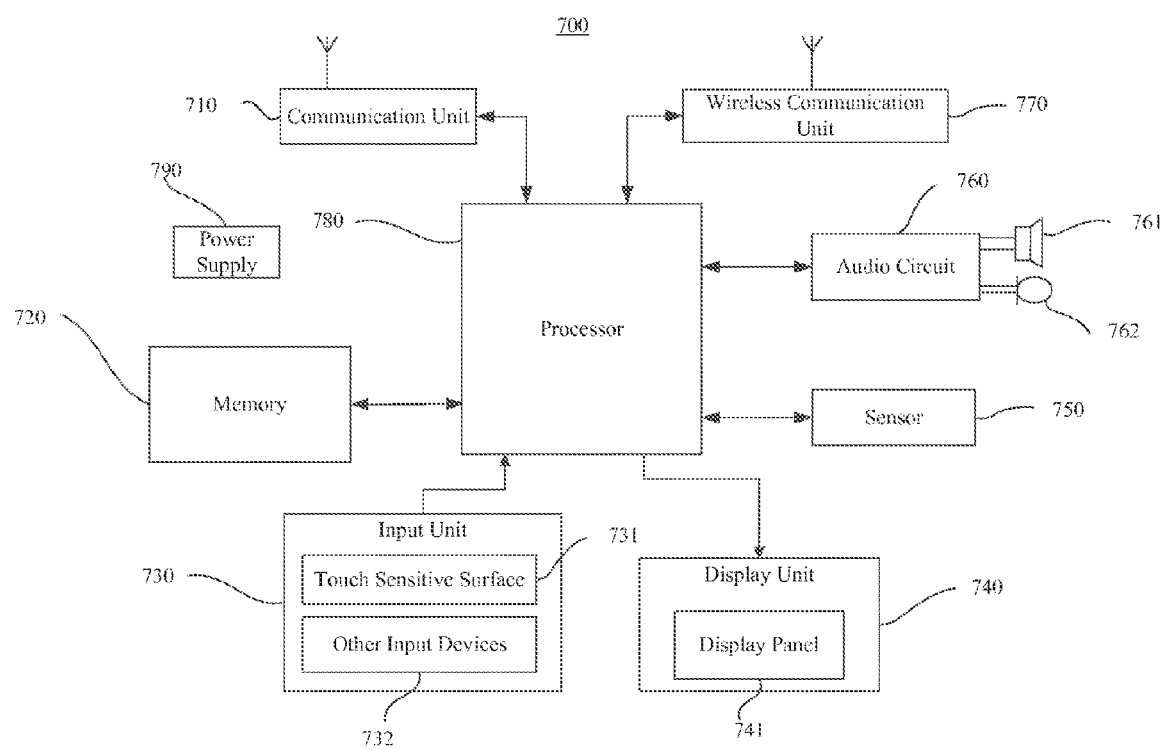
FIG. 7 is an exemplary block diagram of an electronic apparatus, according to an exemplary embodiment.

FIG. 7 illustrates an exemplary block diagram of a electronic device 700, according to an exemplary embodiment. The electronic device 700 is configured to perform any of the above-described battery protection methods.

Referring to FIG. 7, the electronic device 700 may include a communication unit 710, a memory 720 including one or more computer-readable storage mediums, an input unit 730, a display 740, a sensor 750, an audio circuit 760, a wireless communication unit 770, a processor 780 including one or more processing cores, and a power supply 790. The person skilled in the art could appreciate that the structure of the electronic device shown in FIG. 7 does not constitute the limitation to the electronic device 700. The electronic device 700 may include more or less components than those shown in the drawing, or may combine some of the components, or may have different arrangement of the components.

The communication unit 710 is configured to receive and transmit signals during information receipt and transmission or during a call. The communication unit 710 may be a RF (radio frequency) circuit, a router, a modem, or other network communication device. Specifically, in the case that the communication unit 710 is the RF circuit, after receiving the downlink information from the base station, the processor 780 processes the downlink information; additionally, the uplink data is transmitted to the base station. Generally, the RF circuit serving as the communication unit 710 includes, but is not limited to an antenna, at least one amplifier, a tuner, one or more oscillators, a subscriber identity module (SIM) card, a transceiver, a coupler, a LNA (Low Noise Amplifier), a duplexer, etc. Additionally, the communication unit 710 may also communicate with network and other devices via wireless communication. The wireless communication may adopt any communication standards or protocols, including but not limited to GSM (Global System of Mobile communication), GPRS (General Packet Radio Service), CDMA (Code Division Multiple Access), WCDMA (Wideband Code Division Multiple Access), LTE (Long Term Evolution), E-mail, SMS (Short Messaging Service), etc.

The memory 720 is configured to store software programs and modules, and the processor 780 performs various functional applications and data processing by executing the software programs and modules stored in the memory 720. The memory 720 may mainly include a program storage region and a data storage region, wherein the program storage region may store an operation system, an application program required by at least one function (such as an audio playing function, an image playback function) and the like; and the data storage region may store the data created according to the usage of the electronic device 700 (such as audio data, a phone book) and the like. In addition, the memory 720 may include a high-speed random access memory, and may also include a non-transitory memory, such as at least one disc storage device, flash device or other transitory solid-state storage device. Accordingly, the memory 720 may also include a memory controller for providing the processor 780 and the input unit 730 with an access to the memory 720.

The input unit 730 may be configured to receive the input digits or character information, and generate signal inputs of a keyboard, a mouse, a joystick or a trackball related to the user settings and function control. For example, the input unit 730 may include a touch sensitive surface 731 and one or more other input devices 732. The touch sensitive surface 731, which is also referred to as a touch screen or a touch pad, can collect the user's touch operation thereon or thereabout (for example, the user performs operations on the touch sensitive surface 731 or near the touch sensitive surface 731 by using fingers, a stylus, or any suitable object or accessory), and drive the corresponding connected device according to the preset program. Optionally, the touch sensitive surface 731 may include first and second parts, i.e., a touch detection device and a touch controller. The touch detection device detects a touch orientation of the user and signals caused by the touch operation, and transmits the signals to the touch controller. The touch controller receives the touch information from the touch detection device, converts the touch information into a contact coordinate and transmits it to the processor 780, and the touch controller can also receive the instruction from the processor 780 and execute the instruction. Additionally, the touch sensitive surface 731 may be achieved by adopting various types, such as a resistive type, a capacitive type, an infrared ray type, and a surface acoustic wave type. Besides the touch sensitive surface 731, the input unit 730 may also include one or more other input devices 732. For example, the other input devices 732 may include but are not limited to one or more of a physical keyboard, a function key (such as a volume control key, a switch key), a trackball, a mouse and a joystick.

The display 740 is configured to display information input by the user or information provided to the user and various kinds of graphical user interfaces of the electronic device 700, and the graphical user interfaces may be constituted by a graphic, a text, an icon, a video and any combination thereof. The display unit 740 may include a display panel 741. Optionally, the display panel 741 may be configured in the form of a LCD (Liquid Crystal Display), an OLED (Organic Light-Emitting Diode) and the like. Further, the touch sensitive surface 731 may cover the display panel 741. When the touch operation on or near the touch sensitive surface 731 is detected, the touch sensitive surface 731 transmits the touch operation to the processor 780 to determine the type of the touch event, and then the processor 780 provides a corresponding visual output on the display panel 741 according to the type of the touch event. Although in FIG. 7 the touch sensitive surface 731 and the display panel 741 act as two independent components to achieve input and output functions, in some embodiments, the touch sensitive surface 731 and the display panel 741 may be integrated to achieve the input and output functions.

The electronic device 700 may further include at least one sensor 750 which is a pressure sensor for sampling the pressure parameter on the surface of the battery. In addition, the at least one sensor 750 may include a light sensor, a motion sensor, and other sensors. The light sensor may include an ambient light sensor and a proximity sensor, wherein the ambient light sensor may adjust the brightness of the display panel 741 according to the light and shade of the ambient light, and the proximity sensor may turn off the display panel 741 and/or the backlight when the electronic device 700 is moved to the ear. As one type of the motion sensors, the gravity acceleration sensor may detect the magnitude of the acceleration along respective directions (such as along three axes), may detect the magnitude and direction of the gravity when being stationary, and may identify the applications of the attitudes of the mobile phone (such as a horizontal and vertical screen switching, a relevant game, a magnetometer attitude calibration) and functions relevant to vibration identification (such as a pedometer, a percussion) and the like. The electronic device 700 may also be configured with a gyroscope, a barometer, a hygrometer, a thermometer, an infrared sensor and other sensors, which are not repeated herein.

The audio circuit 760 is coupled to a speaker 761 and a microphone 762, and may provide the audio interfaces between the user and the electronic device 700. The audio circuit 760 may transmit an electrical signal converted from the received audio data to the speaker 761, and the speaker 761 converts the electrical signal into an acoustical signal and outputs it. On the other hand, the microphone 762 converts the collected acoustical signal into an electrical signal, the audio circuit 760 receives the electrical signal, converts it into audio data, and outputs the audio data to the processor 780 for processing, then the processed audio data is for example transmitted to another electronic device via the RF circuit 710, or the audio data is output to the memory 720 for further processing. The audio circuit 760 may also include a receiver jack for providing the communication between the peripheral headphone and the electronic device 700.

The wireless communication unit 770 may be a WiFi module, which provides the user with a wireless broadband Internet access. The electronic device 700 may assist the user to send and receive E-mails, browse the web, access the streaming media and the like via the wireless communication unit 770. Although the wireless communication unit 770 is shown in FIG. 7, it is appreciated that the wireless communication unit 770 is not a necessary constitution of the electronic device 700, and can be omitted according to requirements.

The processor 780 is a control center of the electronic device 700. The processor 780 connects respective parts of the electronic device 700 via various interfaces and wirings, and performs various functions of the electronic device 700 and processes data, by running or executing the software programs and/or modules within the memory 720 and calling the data stored in the memory 720. The processor 780 may include one or more processing cores. For example, the processor 780 may integrate with an application processor and a modem processor, wherein the application processor mainly processes the operation system, user interfaces, application programs, etc., and the modem processor mainly processes the wireless communication. In some embodiments, the modem processor may not be integrated into the processor 780.

The power supply 790 is configured to supply power to components of the electronic device 700. For example, the power supply 790 may be connected to the processor 780 logically via a power management system, so as to achieve the functions of a charge management, a discharge management and a power consumption management by the power management system. The power supply 790 may also include any components, such as one or more direct current or alternative current power supplies, recharging systems, power failure detection circuits, power converters or inverters, and power status indicators.

Although not shown in FIG. 7, the electronic device 700 may also include a camera, a Bluetooth module, and the like.

In exemplary embodiments, there is also provided a non-transitory computer-readable storage medium including instructions, such as included in the memory 720, executable by the processor 780 in the electronic device 700, for performing any of the above-described battery protection methods.

In exemplary embodiments, the electronic device 700 may be various handheld terminals, such as a mobile phone, a personal digital assistant (PDA), etc.

In exemplary embodiments, the non-transitory computer-readable storage medium may be a read-only memory (ROM), a programmable ROM (PROM), an electrically programmable ROM (EPROM), an electrically erasable programmable ROM (EEPROM), a flash memory, a random access memory (RAM) which can act as an external cache memory. As an example and not restrictive, RAM may be obtained in various forms, such as a synchronous RAM (DRAM), a dynamic RAM (DRAM), a synchronous DRAM (SDRAM), a double data rate SDRAM (DDR SDRAM), an enhanced SDRAM (ESDRAM), a synchronization link DRAM (SLDRAM), and a direct RambusRAM (DRRAM). The computer-readable storage medium in the present disclosure are intended to include, but not limited to, these and any other suitable types of memory. The computer-readable storage medium may also be a compression disk (CD), a laser disc, an optical disk, a digital versatile disc (DVD), a floppy disks, a blue-ray disk, etc.

The various illustrative logical blocks, modules and circuits described in combination with the contents disclosed herein may be realized or executed by the following components which are designed for performing the above methods: a general purpose processor, a digital signal processor (DSP), an application specific integrated circuit (ASIC), a field programmable gate array (FPGA), or other programmable logic devices, a discrete gate, or a transistor logic, a discrete hardware element or any combination thereof. The general purpose processor may be a microprocessor. Alternatively, the processor may be any conventional processor, controller, microcontroller or state machine. The processor may also be implemented as a combination of the computing devices, such as a combination of a DSP and a microprocessor, a plurality of microprocessors, one or more microprocessor combined with a DSP core, or any other such configurations.

One of ordinary skill in the art will understand that the above described modules can each be implemented by hardware, or software, a combination of hardware and software. One of ordinary skill in the art will also understand that multiple ones of the above described modules may be combined as one module, and each of the above described modules may be further divided into a plurality of sub-modules.

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact construction that has been described above and illustrated in the accompanying drawings, and that various modifications and changes can be made without departing from the scope thereof. It is intended that the scope of the invention only be limited by the appended claims.

What is claimed is:

1. An electronic apparatus, comprising:
a housing;
a battery;
at least one pressure sensor provided on an outer surface of the battery and adjacent to a side of the housing; and
a controller electrically connected with the at least one pressure sensor, wherein
the at least one pressure sensor samples a pressure parameter on the outer surface of the battery; and
the controller is programmed to:
acquire the pressure parameter, detect a magnitude relation between the pressure parameter and a predefined threshold value, and generate a control instruction for protecting the battery based on the detected magnitude relation;
wherein the controller is further programmed to:
detect, at a predetermined time interval, magnitude relations between the pressure parameter and a first threshold value, a second threshold value, and a third threshold value, the first threshold value being lower than the second threshold value, and the second threshold value being lower than the third threshold value; and
generate a reminder information displaying instruction for triggering the electronic apparatus to issue a reminder alert, if the controller detects that the pressure parameter is above the first threshold value and below the second threshold value.

2. The electronic apparatus according to claim 1, wherein the controller is further programmed to generate a sleep instruction for triggering the battery to enter into a sleep state, if the controller detects that the pressure parameter is above the second threshold value and below the third threshold value.

3. The electronic apparatus according to claim 2, wherein the controller is further programmed to:
detect whether the pressure parameter recovers to be below the second threshold value after the battery enters into the sleep state, and
generate a sleep recover instruction for triggering the battery to recover from the sleep state to a normal operating state if the controller detects that the recovered pressure parameter is below the second threshold value.

4. The electronic apparatus according to claim 1, wherein the controller is further programmed to generate a permanent failure instruction for triggering the battery to enter into a permanent failure state, if the detected result is that the pressure parameter is above the third threshold value.

5. The electronic apparatus according to claim 1, wherein, the at least one pressure sensor includes a plurality of pressure sensors, the plurality of pressure sensors are provided at different positions on the outer surface of the battery.

* * * * *